United States Patent
Kwak

(10) Patent No.: US 7,838,941 B2
(45) Date of Patent: Nov. 23, 2010

(54) ELECTROSTATIC DISCHARGE PROTECTION DEVICE HAVING A DUAL TRIGGERED TRANSISTOR

(75) Inventor: Kook Whee Kwak, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 151 days.

(21) Appl. No.: 11/963,910

(22) Filed: Dec. 24, 2007

(65) Prior Publication Data

US 2008/0179681 A1    Jul. 31, 2008

(30) Foreign Application Priority Data

Dec. 29, 2006    (KR) .................... 10-2006-0138528

(51) Int. Cl.
  *H01L 29/72* (2006.01)
(52) U.S. Cl. .................. 257/360; 257/173; 257/358; 257/363; 361/56; 361/91.1
(58) Field of Classification Search .......... 257/173, 257/358, 360, 363; 361/56, 91.1
  See application file for complete search history.

(56) References Cited

U.S. PATENT DOCUMENTS

2004/0233595 A1 * 11/2004 Ker et al. .................. 361/56

FOREIGN PATENT DOCUMENTS

| KR | 1020000015065 A | 3/2000 |
| KR | 1020000060695 A | 10/2000 |
| KR | 10-0631955 B1 | 9/2006 |
| KR | 10-0639231 B1 | 10/2006 |

* cited by examiner

*Primary Examiner*—Edward Wojciechowicz
(74) *Attorney, Agent, or Firm*—Ladas & Parry LLP

(57) ABSTRACT

Disclosed is an electrostatic discharge protection device that has a low trigger voltage and protects an internal circuit from electrostatic discharge. The ESD protection device includes an NMOS transistor in which a first pad and a drain are connected to each other and a second pad and a source are connected to each other. A capacitor in which an end is connected to the first pad and the other end is connected to a gate of the NMOS transistor and a substrate contact of the NMOS transistor. The ESD protection devices also includes a resistor in which an end is connected to the second pad and the other end is connected to the capacitor. The first pad may be a power pad and the second pad may be a ground pad. Alternately, the first pad may be an input/output pad and the second pad may be a ground pad.

14 Claims, 7 Drawing Sheets

ELECTROSTATIC DISCHARGE PROTECTION DEVICE HAVING A DUAL TRIGGERED TRANSISTOR

CROSS-REFERENCE TO RELATED APPLICATIONS

The present application claims priority to Korean patent application number 10-2006-0138528 filed on Dec. 29, 2006, which is incorporated herein by reference in its entirety.

BACKGROUND OF THE INVENTION

The present invention relates generally to a semiconductor device, and more particularly to an electrostatic discharge protection device that protects an internal circuit from electrostatic discharge.

In general, a semiconductor device is provided with an electrostatic discharge (ESD) protection circuit as shown in FIGS. 1A to 3B. The ESD protection circuit is placed between an input/output pad and an internal circuit to prevent damage of the internal circuit due to excessive current having a large energy generated when static electricity charged in a human body or a machine is discharged to the internal circuit or the static electricity charged in the internal circuit flows to an external object.

Referring to FIGS. 1A and 1B, an ESD protection device having a grounded gate NMOS (GGNMOS) transistor protects an internal circuit 120 as a parasitic bipolar NPN transistor 130. The GGNMOS transistor N10 operates to discharge the static electricity generated between an input/output pad 101 and a ground pad 102.

More specifically, when static electricity is generated between the input/output pad 101 and the ground pad 102, a static electricity voltage due to the static electricity is applied between an N-type impurity region 106 as a collector and an N-type impurity region 108 as an emitter.

If the voltage exceeds the avalanche breakdown voltage of the PN junction formed with a P-well region 105 as a base and the N-type impurity region 106 as a collector, a plurality of electron-hole pairs is produced in a depletion region of the PN junction region and the electrons flow to the collector 106. The holes flow through the P-well region to a P-type impurity region 109 as a substrate contact of the transistor.

As the current due to the hole flows through a P-well resistor 131, a voltage drop is generated in the P-well region that causes a forward bias voltage to be applied across the PN junction between the N-type impurity region 108 as an emitter and the P-well region 105 as a base.

When the bias voltage becomes higher than the PN junction cut-in voltage of 0.7 V, the hole flows from the N-type impurity region 106 as a collector to the N-type impurity region 108 as an emitter and the electron flows in reverse, thereby triggering an operation of the NPN bipolar transistor 130.

However, since the avalanche breakdown voltage triggering the operation of the NPN bipolar transistor 130 in the GGNMOS transistor N10 is generally very high, i.e., over 6 to 7V, the ESD protection device provided with a GGNMOS transistor has a high trigger voltage which causes a problem.

Referring to FIGS. 2A and 2B, an ESD protection device having a gate coupled NMOS (GCNMOS) transistor detects alternating current (AC) components of static electricity using a RC circuit composed of a resistor 111 and a capacitor 110 and applies the components as a bias voltage to the gate 107.

Since the bias voltage is applied to the gate 107, the operation of the NPN bipolar transistor 130 is triggered at a voltage lower than the gate ground avalanche breakdown voltage, thereby lowering the trigger voltage as compared to the GGNMOS transistor.

Referring to FIGS. 3A and 3B, an ESD protection device having a substrate-triggered NMOS (STNMOS) transistor applies the AC components of static electricity to the P-well region 105 of the NPN bipolar transistor using the RC circuit and thus induces the current.

The base current triggers the operation of the NPN bipolar transistor 130 at a voltage lower than the gate ground avalanche breakdown voltage thereby lowering the trigger voltage as compared to the GGNMOS transistor.

However, the ESD protection device having either the GCNMOS transistor N20 or the STNMOS transistor N30 should include a RC circuit having a RC time constant of at least several ns for effective operation. A problem arises in that the area of the RC circuit is therefore increased.

SUMMARY OF THE INVENTION

Accordingly, the present invention provides, inter alia, an electrostatic discharge protection device having a dual triggered transistor coupling an RC circuit to a gate of a transistor and a substrate to lower an trigger voltage.

The present invention also provides, inter alia, an electrostatic discharge protection device that triggers the gate of the transistor and the substrate by the alternating current component of static electricity to improve the area of an RC circuit.

To achieve these, according to a first aspect of the present invention, there is provided an electrostatic discharge protection device, which includes an NMOS transistor in which a first pad and a drain are connected to each other and a second pad and a source are connected to each other; a capacitor in which an end thereof is connected to the first pad and the other end thereof is connected to a gate of the NMOS transistor and a substrate contact of the NMOS transistor; and a resistor in which an end thereof is connected to the second pad and the other end thereof is connected to the capacitor.

The first pad may be a power pad and the second pad may be a ground pad.

Alternately, the first pad may be an input/output pad and the second pad may be a ground pad.

According to a second aspect of the present invention, there is provided an electrostatic discharge protection device, which includes a PMOS transistor in which a first pad and a drain are connected to each other and a second pad and a source are connected to each other; a resistor in which an end thereof is connected to the first pad and the other end thereof is connected to a gate of the PMOS transistor and a substrate contact of the PMOS transistor; and a capacitor in which an end thereof is connected to the second pad and the other end thereof is connected to the resistor.

The first pad may be a power pad and the second pad may be a ground pad.

Alternately, the first pad may be an input/output pad and the second pad may be a ground pad.

According to a third aspect of the present invention, there is provided an electrostatic discharge protection device, which includes an NMOS transistor in which a first pad and a drain are connected to each other and a second pad and a source are connected to each other; a resistor in which an end thereof is connected to the first pad and the other end is connected to a substrate contact of the NMOS transistor; a capacitor in which an end thereof is connected to the second pad and the other end is connected to the other end of the resistor; and an inverter connected between a gate of the NMOS transistor and the other end of the resistor.

Herein, the inverter may have an input terminal connected to the other end of the resistor and an output terminal connected to the gate of the NMOS transistor.

Further, the first pad may be a power pad and the second pad may be a ground pad.

Alternately, the first pad may be an input/output pad and the second pad may be a ground pad.

According to a fourth aspect of the present invention, there is provided an electrostatic discharge protection device, which includes a PMOS transistor in which a first pad and a drain are connected to each other and a second pad and a source are connected to each other; a capacitor in which an end thereof is connected to the first pad and the other end is connected to a substrate contact of the PMOS transistor; a resistor in which an end thereof is connected to the second pad and the other end is connected to the other end of the capacitor; and an inverter connected between a gate of the PMOS transistor and the other end of the capacitor.

Herein, the inverter may have an input terminal connected to the other end of the capacitor and an output terminal connected to the gate of the PMOS transistor.

Further, the first pad may be a power pad and the second pad may be a ground pad.

Alternately, the first pad may be an input/output pad and the second pad may be a ground pad.

DESCRIPTION OF SPECIFIC EMBODIMENTS

The present invention relates to an electrostatic discharge (ESD) protection device having a dual triggered MOS (DT-MOS) transistor coupling a RC circuit to a gate of a transistor and a substrate to minimize an area of the RC circuit and lower an trigger voltage.

Figure 1A:
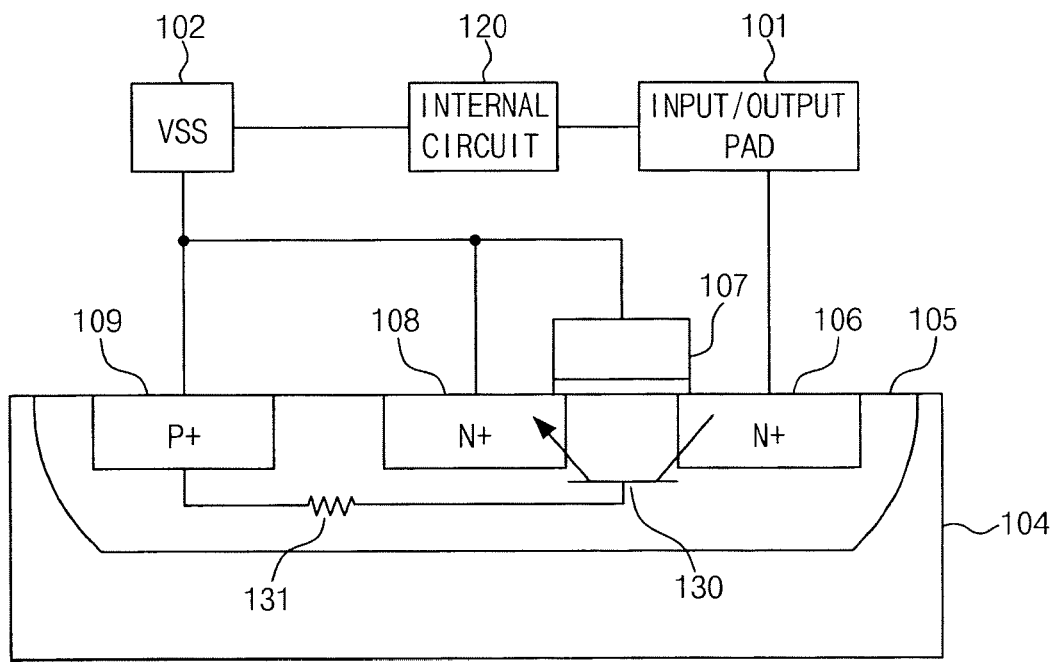
FIGS. 1A and 1B are respectively a cross-sectional view shown with interconnected circuit blocks and a circuit diagram showing a GGNMOS transistor which is an electrostatic discharge (ESD) protection device according to the prior art.
Figure 1B:
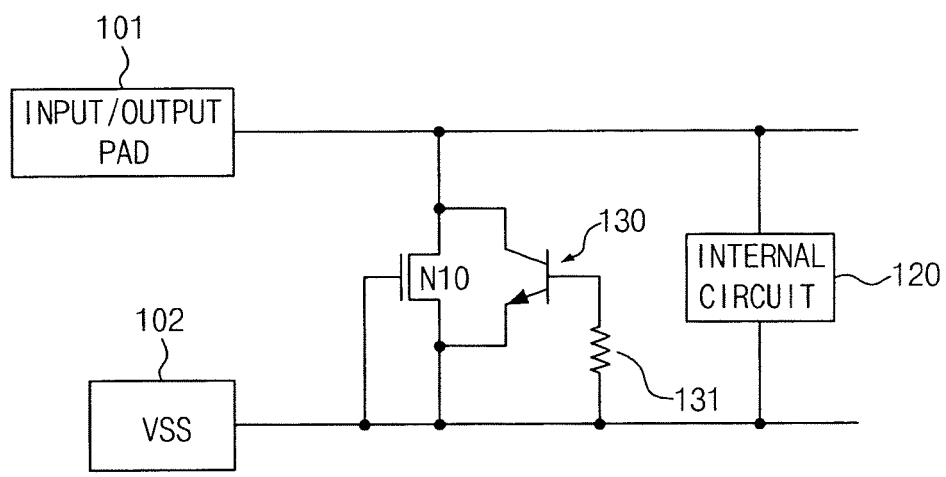
Figure 2A:
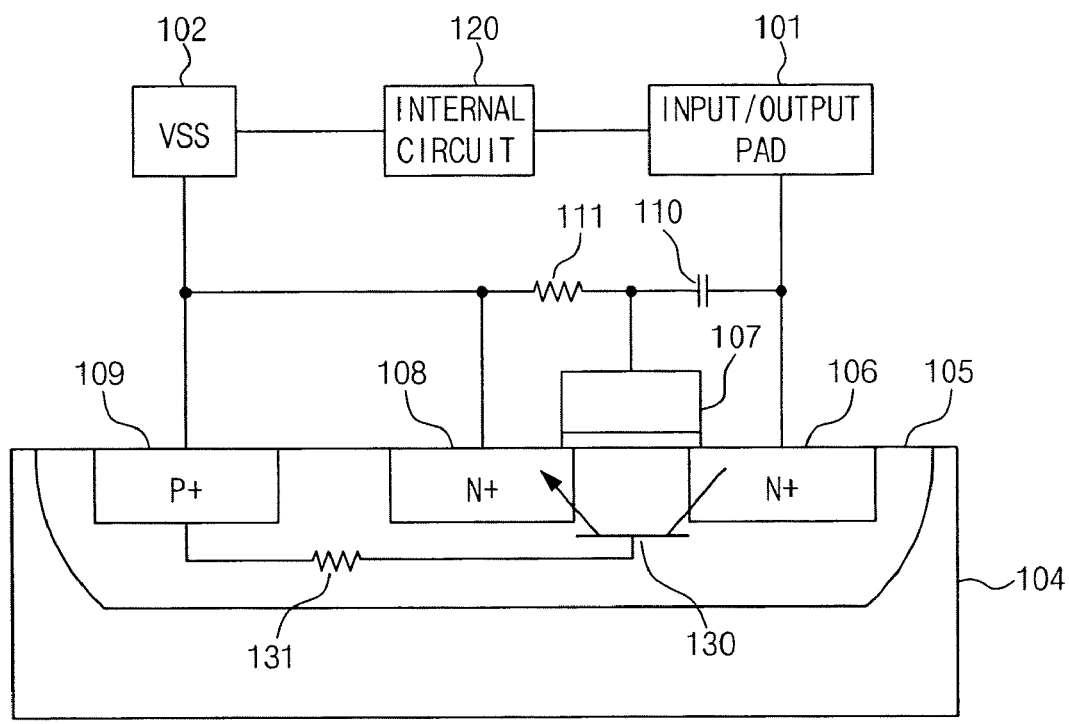
FIGS. 2A and 2B are respectively a cross-sectional view shown with interconnected circuit blocks and a circuit diagram showing a GCNMOS transistor which is an ESD protection device according to the prior art.
Figure 2B:
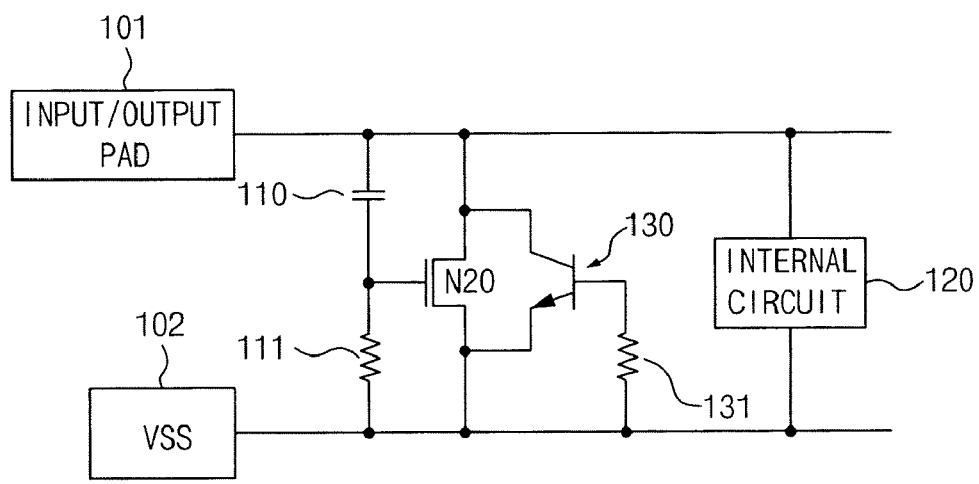
Figure 3A:
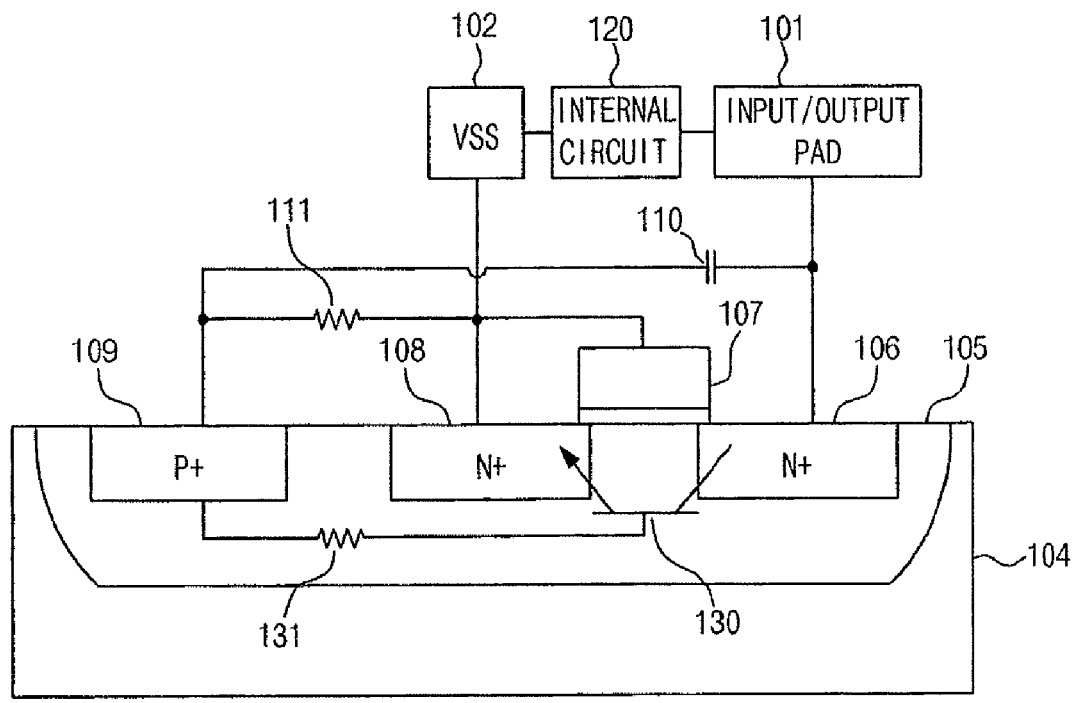
FIGS. 3A and 3B are respectively a cross-sectional view interconnected circuit blocks and a circuit diagram showing a STNMOS transistor which is an ESD protection device according to the prior art.
Figure 3B:
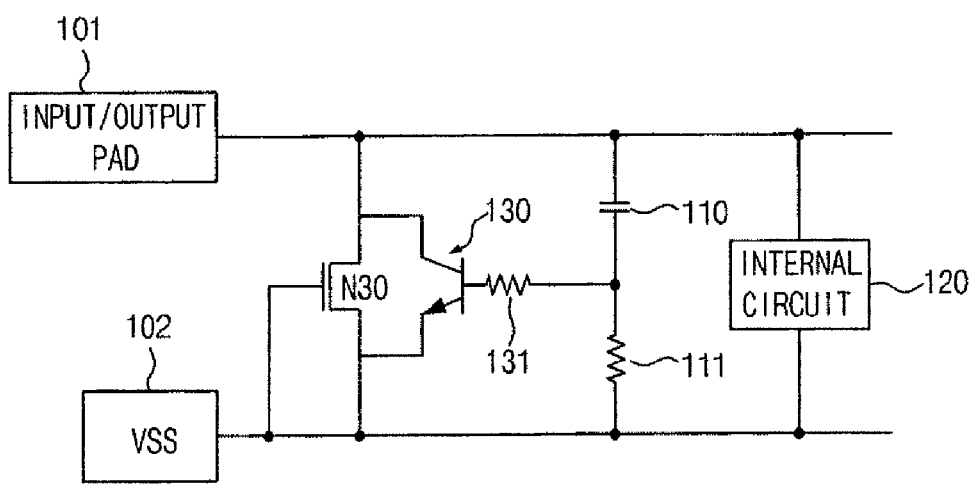
Figure 4A:
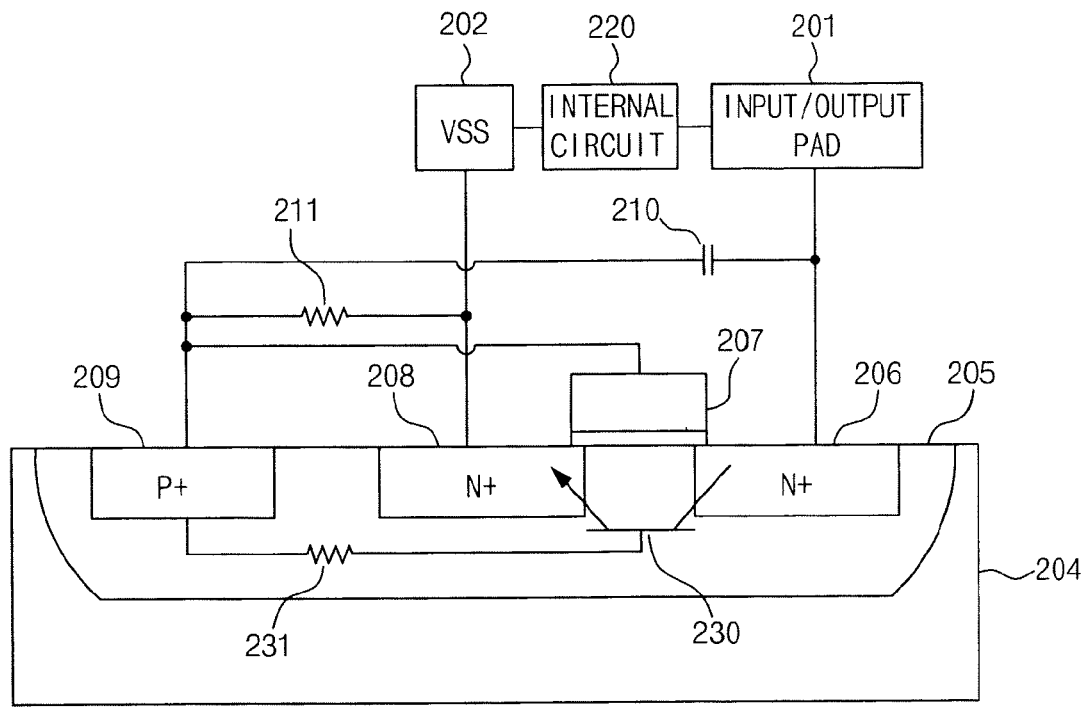
FIGS. 4A and 4B are respectively a cross-sectional view interconnected circuit blocks and a circuit diagram showing a DTNMOS transistor which is an ESD protection device according to a first embodiment of the present invention.
Figure 4B:
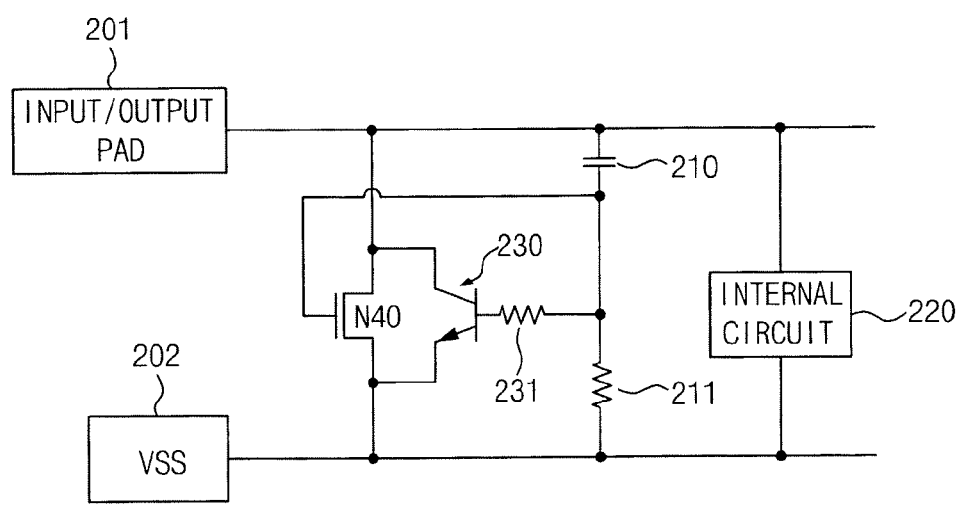

Referring to FIGS. 4A and 4B, in an ESD protection device having a dual triggered NMOS (DTNMOS) transistor according to a first embodiment of the present invention, a RC circuit is coupled to a gate 207 and a P-type impurity region 209 as a substrate contact of a P-well region 205 of a NMOS transistor N40.

More specifically, in the ESD protection device having a DTNMOS transistor, when static electricity is generated between an input/output pad 201 and a ground pad 202, AC current flows due to an increase in electrostatic voltage according to time through a capacitor 210 and a resistor 211 to the ground pad 202 causing a voltage drop.

Therefore, a voltage is induced in the gate 207 of the NMOS transistor N40 that is connected to a terminal between the capacitor 210 and the resistor 211. Current flows to the P-well region 205 as a base of a NPN bipolar transistor 230. At the same time, a voltage due to static electricity is also applied between an N-type impurity area 206 as a collector of the NPN bipolar transistor 230 and N-type impurity region 208 as an emitter.

As such, the avalanche breakdown of the PN junction composed of the collector 206 and the base 205 is generated at a voltage lower than the prior art by the base current which flows in the P-well region 205 and the voltage applied to the gate 207 of the NMOS transistor N40 and then turning on the NPN bipolar transistor 230.

It is therefore possible to realize an ESD protection device having an trigger voltage lower than that of the prior art using the same RC value as the prior art. It is also possible to realize an ESD protection device having a RC time constant smaller than that of the prior art, i.e., having a decreased area of the RC circuit and the same trigger voltage as the prior art.

Figure 5:
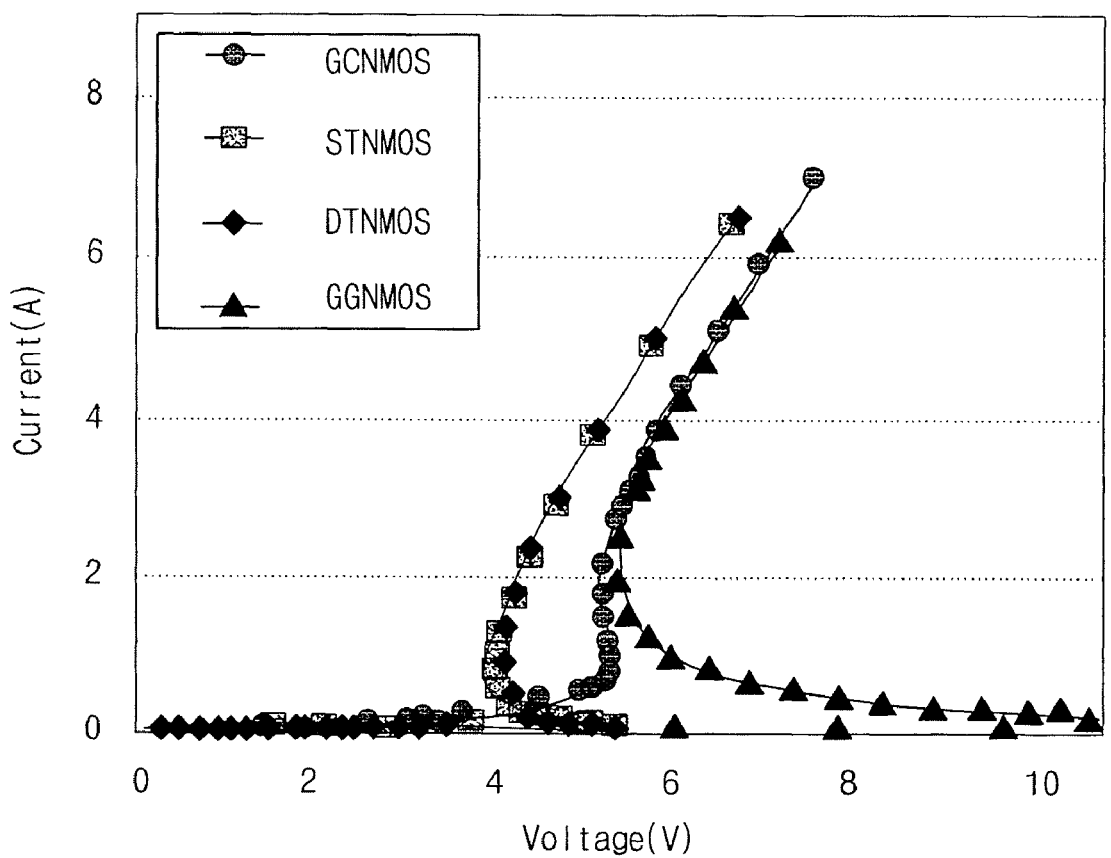
FIG. 5 is a waveform diagram illustrating simulation results of ESD operations of the ESD protection devices according to the prior art and the first embodiment of the present invention.

FIG. 5 illustrates simulation results of ESD operations of the ESD protection devices according to the prior art and the present invention.

The above simulation was carried out using Technology CAD (TCAD) software. Drain current characteristics according to drain-source voltage variations of respective NMOS transistors (GGNMOS, GCNMOS, STNMOS and DTNMOS) were compared in the simulation.

In FIG. 5, the X-axis represents a voltage applied to the drain of the NMOS transistor when the operation of the NPN bipolar transistor is triggered. The Y-axis represents current flowing between the ground pad and the input/output pad when the ESD protection device operates.

Referring to FIG. 5, the simulation results show that a drain-source voltage is increased to a certain voltage and then suddenly decreases while current is rapidly increased in every NMOS transistor. The voltage at this time is the trigger voltage by which the NPN bipolar transistor is turned on. After that, a snapback occurs and the voltage is increased with the increase in the current.

The trigger voltage of the DTNMOS transistor according to the present invention is about 5.4V. This is the same as the trigger voltage of the GCNMOS and STNMOS of the prior art and is significantly lower by 50% as compared to the trigger voltage, i.e. 10.8V, of the GGNMOS transistor.

Meanwhile, the GCNMOS transistor requires a 12 kΩ resistor and a 2.4 pF capacitor to lower the trigger voltage to about 5.4V. The STNMOS transistor requires a 1.5 kΩ resistor and a 0.3 pF capacitor. However, the DTNMOS transistor requires only a 0.5 kΩ resistor and a 0.1 pF capacitor in contrast.

In other words, for the DTNMOS transistor, the RC value required to lower the trigger voltage to half of that of the GCNMOS transistor is reportedly ¹/₂₄ the RC value of the GCNMOS transistor and ¼ the RC value of the STNMOS transistor.

Figure 6A:
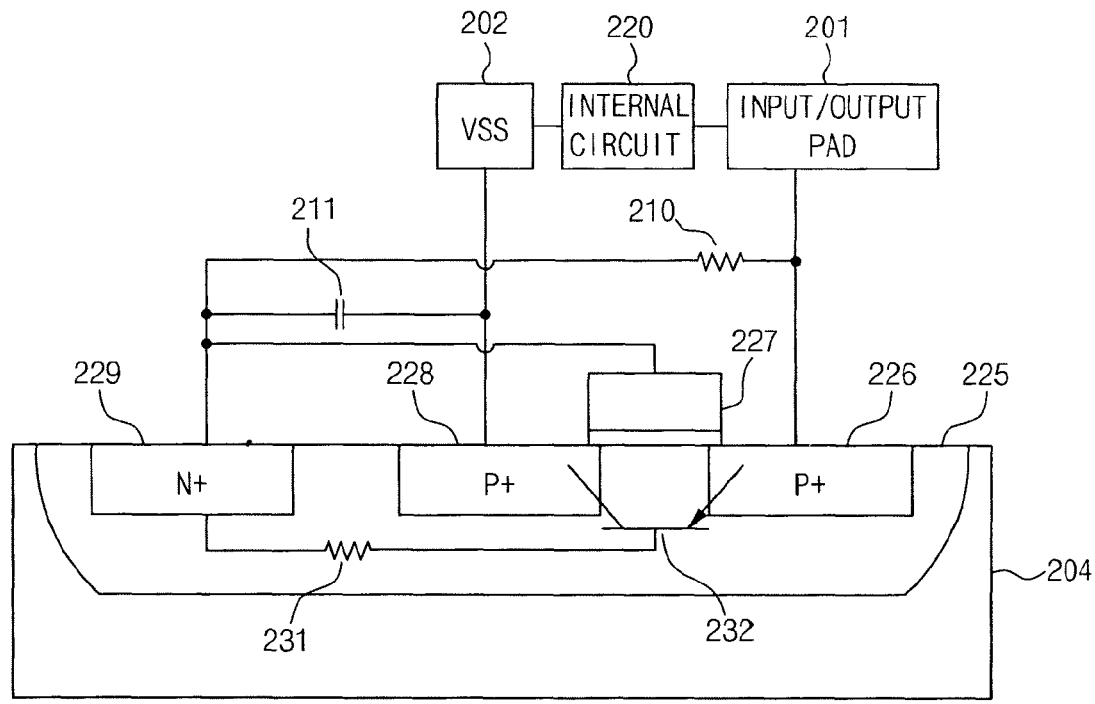
FIGS. 6A and 6B are respectively a cross-sectional view interconnected circuit blocks and a circuit diagram showing a DTNMOS transistor which is an ESD protection device according to a second embodiment of the present invention.
Figure 6B:
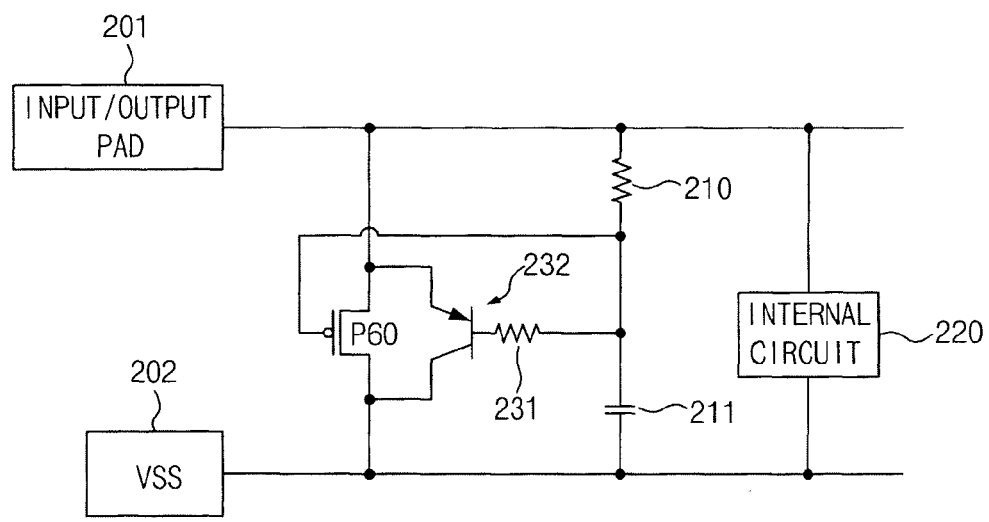

Referring to FIGS. 6A and 6B, in an ESD protection device having a DTNMOS transistor according to a second embodiment of the present invention, a RC circuit is coupled to a gate 227 and an N-type impurity region 229 as a substrate contact of an N-well region 225 of a PMOS transistor P60.

More specifically, in the ESD protection device having a DTNMOS transistor, when static electricity is generated between an input/output pad 201 and a ground pad 202, AC current flows due to an increase in electrostatic voltage according to time through a capacitor 211 and a resistor 210 to the ground pad 202 causing a voltage drop.

Therefore, a voltage lower than the voltage of the P-type impurity region 226 as a drain or an emitter is applied to the gate 227 of the PMOS transistor P60 that is connected to a terminal between the capacitor 210, the resistor 211, and the N-well region 225 as a base of the PNP bipolar transistor 232.

At the same time, a voltage due to static electricity is also applied between the P-type impurity region 226 as the drain and the P-type impurity region 228 as a collector of the PNP bipolar transistor 232.

As such, the avalanche breakdown of the PN junction composed of the collector 228 and the base 225 is generated at a voltage lower than the prior art by the base current which flows in the N-well region 225 and the voltage applied to the gate 227 of the PMOS transistor P60 and then turning on the PNP bipolar transistor 232.

It is therefore possible to realize an ESD protection device having an trigger voltage lower than that of the prior art using the same RC value as the prior art. It is also possible to realize an ESD protection device having a RC time constant smaller than that of the prior art, i.e., having a decreased area of the RC circuit and the same trigger voltage as the prior art.

Figure 7:
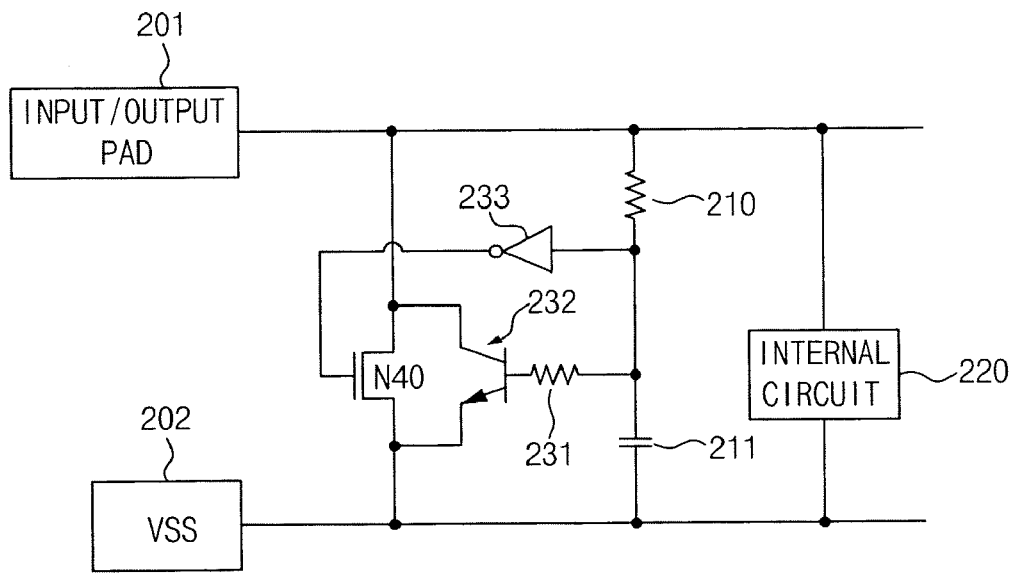
FIG. 7 is a circuit diagram showing a DTNMOS transistor which is an ESD protection device according to a third embodiment of the present invention.

Referring to FIG. 7, an ESD protection device having a DTNMOS transistor according to a third embodiment of the present invention has a structure and effect similar to that of the first embodiment. However, unlike the first embodiment, an end of the resistor 210 of the RC circuit is connected to the input/output pad 201 and an end of the capacitor 211 is connected to the ground pad 202. An inverter 233 is also connected between the RC circuit and the gate of the NMOS transistor N40.

Figure 8:
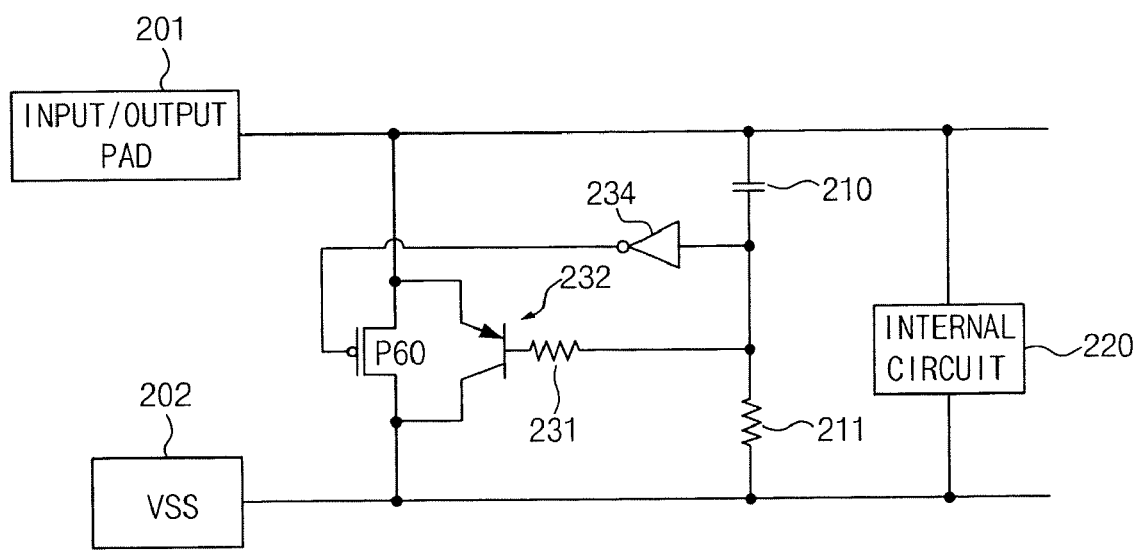
FIG. 8 is a circuit diagram showing a DTNMOS transistor which is an ESD protection device according to a fourth embodiment of the present invention.

Referring to FIG. 8, an ESD protection device having a DTNMOS transistor according to a fourth embodiment of the present invention has a structure and effect similar to that of the second embodiment. However, unlike the second embodiment, an end of the resistor 210 of the RC circuit is connected to the ground pad 202 and an end of the capacitor 211 is connected to the input/output pad 201. An inverter 234 is also connected between the RC circuit and the gate of the PMOS transistor P60.

According to the embodiments as described above, the present invention provides an ESD protection device having a dual triggered transistor coupling an RC circuit to a gate of a transistor together with a substrate thereby having the advantage of lowering an trigger voltage.

In addition, the present invention provides an ESD protection device that triggers the gate of the transistor and the substrate by the alternating current component of static electricity to reduce the area of the RC circuit thereby improving area consumption of the ESD protection device.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An electrostatic discharge protection device, comprising:
   a NMOS transistor whose drain is coupled to a first pad and whose source is coupled to a second pad;
   a capacitor in which a first end is coupled to the first pad and a second end is coupled to a gate of the NMOS transistor;
   a first resistor in which a first end is coupled to the second pad and a second end is coupled to the second end of the capacitor:
   a bipolar function transistor whose emitter is coupled to the source of the NMOS transistor, whose collector is coupled to the drain of the NMOS transistor; and
   a second resistor coupled to the gate of the NMOS transistor and a base of the bipolar function transistor.

2. The electrostatic discharge protection device as set forth in claim 1, wherein the first pad is a power pad and the second pad is a ground pad.

3. The electrostatic discharge protection device as set forth in claim 1, wherein the first pad is an input/output pad and the second pad is a ground pad.

4. An electrostatic discharge protection device, comprising:
   a PMOS transistor whose drain coupled to a first pad and whose source is coupled a second pad;
   a first resistor in which a first end is coupled to the first pad and a second end is directly coupled to a gate of the PMOS transistor;
   a capacitor in which a first end is coupled to the second pad and a second end is coupled to the second end of the first resistor;
   a bipolar junction transistor whose emitter is coupled to the source of the PMOS transistor, whose collector is coupled to the drain of the PMOS transistor; and
   a second resistor coupled to the gate of the PMOS transistor and a base of the bipolar junction transistor.

5. The electrostatic discharge protection device as set forth in claim 4, wherein the first pad is a power pad and the second pad is a ground pad.

6. The electrostatic discharge protection device as set forth in claim 4, wherein the first pad is an input/output pad and the second pad is a ground pad.

7. An electrostatic discharge protection device, comprising:
   a NMOS transistor in which a first pad and a drain of the NMOS transistor are connected to each other and a second pad and a source of the NMOS transistor are connected to each other;
   a resistor in which a first end is connected to the first pad and a second end is connected to a substrate contact of the NMOS transistor;
   a capacitor in which a first end is connected to the second pad and a second end is connected to the second end of the resistor; and
   an inverter connected between a gate of the NMOS transistor and the second end of the resistor.

8. The electrostatic discharge protection device as set forth in claim 7, wherein the inverter has an input terminal connected to the second end of the resistor and an output terminal connected to the gate of the NMOS transistor.

9. The electrostatic discharge protection device as set forth in claim 7, wherein the first pad is a power pad and the second pad is a ground pad.

10. The electrostatic discharge protection device as set forth in claim 7, wherein the first pad is an input/output pad and the second pad is a ground pad.

11. An electrostatic discharge protection device, comprising:
   a PMOS transistor in which a first pad and a drain of the PMOS transistor are connected to each other and a second pad and a source of the PMOS transistor are connected to each other;
   a capacitor in which a first end is connected to the first pad and a second end is connected to a substrate contact of the PMOS transistor;
   a resistor in which a first end is connected to the second pad and a second end is connected to the second end of the capacitor; and
   an inverter connected between a gate of the PMOS transistor and the second end of the capacitor.

12. The electrostatic discharge protection device as set forth in claim 11, wherein the inverter has an input terminal connected to the second end of the capacitor and an output terminal connected to the gate of the PMOS transistor.

13. The electrostatic discharge protection device as set forth in claim 11, wherein the first pad is a power pad and the second pad is a ground pad.

14. The electrostatic discharge protection device as set forth in claim 11, wherein the first pad is an input/output pad and the second pad is a ground pad.

* * * * *